United States Patent [19]

Chung

[11] Patent Number: 5,444,729
[45] Date of Patent: Aug. 22, 1995

[54] HIGH POWER, HIGH PULSE REPETITION FREQUENCY, COMPACT, PULSED LASER DIODE DRIVER

[76] Inventor: Hyung D. Chung, 1-601 Jam Won Family Apt., Jam Won Dong, Seocho Ku, Seoul, Rep. of Korea

[21] Appl. No.: 284,821

[22] Filed: Aug. 2, 1994

Related U.S. Application Data

[63] Continuation-in-part of Ser. No. 215,288, Mar. 21, 1994, Pat. No. 5,406,572.

[30] Foreign Application Priority Data

Apr. 14, 1994 [KR] Rep. of Korea ............... 94-7835

[51] Int. Cl.6 ............................................. H01S 3/00
[52] U.S. Cl. ............................... 372/38; 372/29; 372/82
[58] Field of Search ............................ 372/82, 38, 29

*Primary Examiner*—Léon Scott, Jr.
*Attorney, Agent, or Firm*—Nolte, Nolte and Hunter

[57] ABSTRACT

A high power, pulsed laser driver including a low impedance energy storage capacitor having a non-uniform stripline structure or a uniform stripline structure, thereby capable of greatly reducing the loss of electrical energy of the laser array while maintaining high efficiency, light weight and compactness.

3 Claims, 7 Drawing Sheets

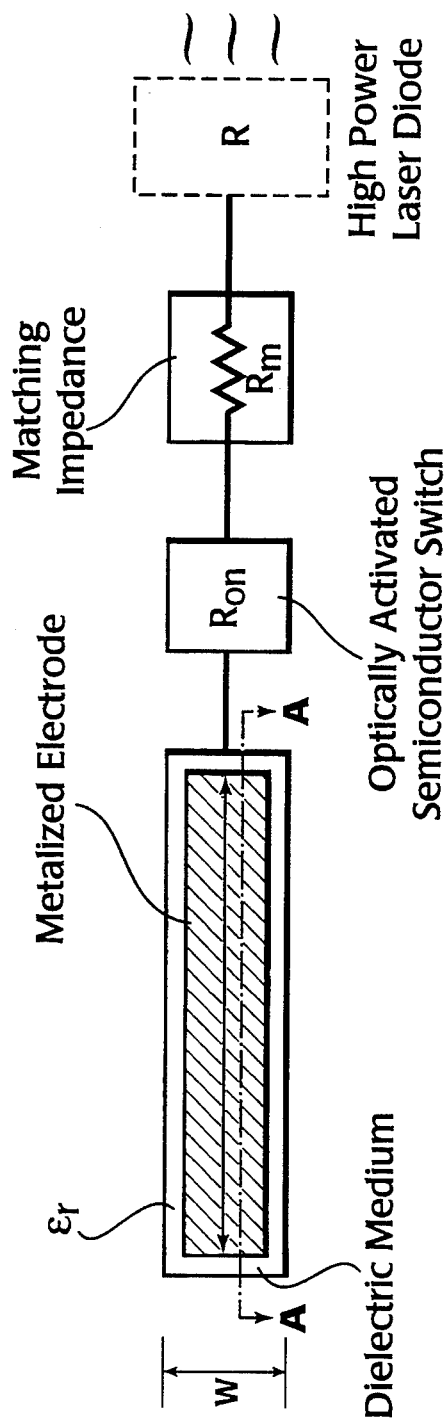
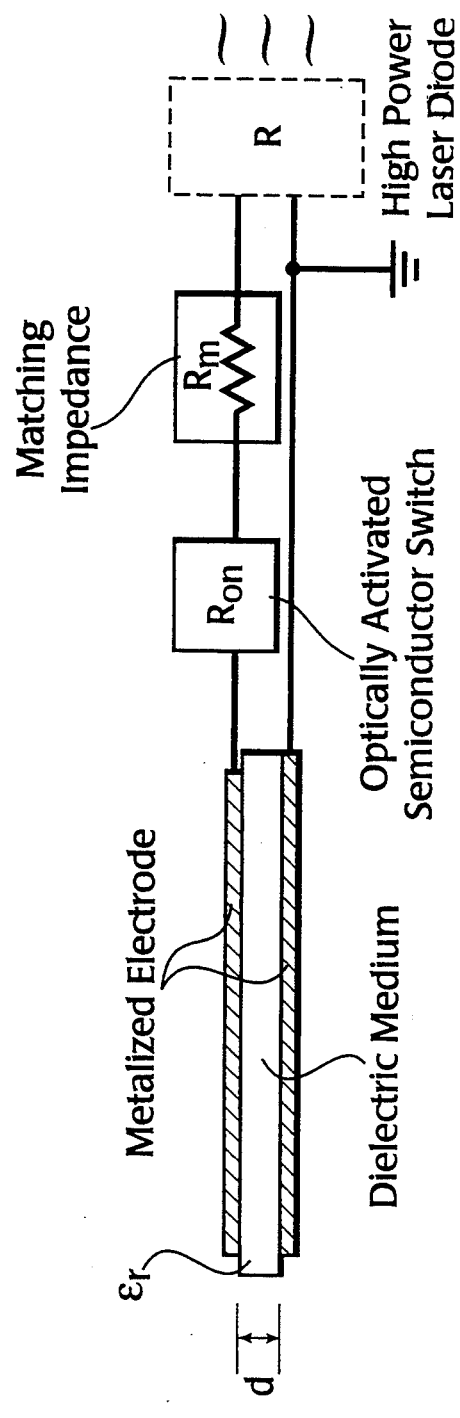
Fig. 4a
Fig. 4b

Pulse Biased Voltage

Drive Triggering in Time
Pulse Biased Voltage Waveform

Triggering Optical Light Power

Semiconductor Triggering Optical Pulse Waveform

High Power Laser Array Driving Current $(t_1+\Delta t) + (2 \times$ Two-way wave transit time)

Fig. 7a Pulse Biased Voltage

Pulse Bias Voltage to the Energy Storage Capacitor

Fig. 7b Triggering Optical Pulse

PW' = Pulse Width of the Triggering Optical Pulse $$PW = \frac{2 \times \sqrt{\varepsilon_r} \times L}{3 \times 10^{10}} \text{ (S)}$$

Pulse Waveform of the Triggering Optical Pulse

HIGH POWER, HIGH PULSE REPETITION FREQUENCY, COMPACT, PULSED LASER DIODE DRIVER

BACKGROUND OF THE INVENTION

1. Field of the Invention

The present invention is a CIP of application Ser. No. 08/215,288, filed on Mar. 21, 1994, now U.S. Pat. No. 5,406,572, and relates to a laser diode driver, and more particularly to a high power, high pulse repetition frequency (PRF), pulsed laser diode driver.

2. Description of the Prior Art

Generally, laser drivers are mainly classified into gas lasers, solid-state lasers and semiconductor lasers. Although generating a high output power, gas lasers and solid-state lasers are bulky, heavy and expensive. Furthermore, they exhibit a deterioration in efficiency. On the other hand, semiconductor lasers are compact, light, inexpensive and very efficient. By virtue of such advantages, the utilization of the semiconductor lasers have recently been on increasing trend.

In spite of such advantages, the semiconductor lasers have a disadvantage of a very low resistance. Due to such a very low resistance, the semiconductor lasers require a laser driver as a high power, power transfer device for their activation.

Conventional high power pulsed laser driver have a very high circuit impedance. Due to the severe impedance mismatch between the driver circuit (high impedance) and the laser array (extremely low impedance), rather than the electrical energy is used to operate the laser array, most of it is lost in the form of heat. However, for the operation of the high power semiconductor laser, current beyond the threshold level should be supplied to the semiconductor laser. Therefore, the lost energy as heat has to be compensated by increasing the pulse biasing voltage.

Therefore, the conventional high power, pulsed driver is designed with much high power capability. This requires even higher power semiconductor switch.

In the conventional high power, pulsed driver, as the lost energy is increased, the required power capability of the semiconductor switch goes up steeply. As a result, the capabilities of the laser driver such as the rise and fall times, pulsewidth and pulse repetition frequency of the output laser pulse deteriorates rapidly, while steeply increasing the size and weight of the driver.

When a semiconductor laser diode having a GaAlAs p-n junction is forward biased, electrons from n-type material recombine with holes from p-tape material, releasing optical energy at the junction. The optical energy covers a wide range of wavelength, ranging from well over 1,000 nm (1,000 × $10^{-9}$ m) to red light region.

A critical parameter in the semiconductor laser diode operation is the supplied current level. At low current levels, namely, below threshold current level, laser diodes generate some spontaneous emission without laser output (laser light). As the current level increases, diode lasers pass a threshold where the population in the laser diode medium becomes inverted and laser action begins.

Therefore, below threshold current, very little laser light is emitted and its emission efficiency is very low. Once the current level passes the threshold, the light output rises steeply.

High power laser diodes, called the laser diode stripes or laser arrays, are produced by fabricating a large number of laser diodes on a single substrate. The laser output power level is proportional to the numbers of the laser diodes in the laser array. Obvious advantages of this fabrication technique are low manufacturing cost, mass production, miniaturization, and high reliability. The disadvantage is an extremely low on-state device resistance (much less than 1 ohm).

Because the laser arrays are fabricated by connecting numerous numbers of forward biased p-n junction device, namely, laser diode, in parallel, the on-state resistance of the laser arrays goes down as the numbers of the laser diodes in the array increase. Typically, on-state resistance of the high power laser arrays is in the range of a few ohms to less than 0.01 ohm. Meanwhile, as the output power level of the laser arrays increases (number of the laser diodes in the array gets bigger), the threshold current level for these lasers rises steeply.

The modulation scheme for the pulsed high power laser operation is a direct modulation in which the laser light is modulated by controlling the current flow into the laser array. For the high power, high PRF, pulsed laser operation, very high current pulse at high PRF has to be generated by the laser driver and delivered to an extremely low impedance load (laser array).

The capabilities of conventional high power, pulsed laser drivers primary depend on the capabilities of the high power semiconductor switches (such as silicon controlled rectifier (SCR), power field effect transistor (power FET), IGBT (insulated gate bipolar transistor and power bipolar transistor).

The conventional high power pulsed laser driver, utilizing a circuit topology in which the high voltage capacitor is pulse biased and then the electrical energy is discharged by turning on the power semiconductor switch, has a very high circuit impedance. Due to the severe impedance mismatch between the driver circuit (high impedance and the laser array (extremely low impedance), rather than the electrical energy is used to operate the laser array, most of it is lost in the form of heat. The amounts of generated heat are so large that a fan has to be installed to remove this heat from the driver. Further, since the operation of a laser array requires certain current level, the lost energy has to be compensated by increasing the biasing voltage.

Therefore, the conventional high power, pulsed driver is designed with much high power capability. This requires even higher power semiconductor switch. (In general, as the power capability of the semiconductor switch goes up, the rise and fall times of this switch substantially slow down and its PRF decreases rapidly).

As the power handling capability of the conventional laser driver goes up, the capabilities (such as the rise and fall times, pulsewidth and PRF of the output laser pulse) of the laser driver deteriorates rapidly, while steeply increasing the size and weight of the driver.

As a result, the conventional high power, pulsed drivers are heavy and very bulky, compared to the laser arrays, and their capabilities such as the rise time, fall time and PRF are severely limited.

Beside the peak laser output power capability, other important and critical parameters of the pulsed laser driver are modulation speed (high PRF), pulsewidth, efficiency, weight and compactness. There is no available pulsed laser driver producing high peak power light pulse with narrow pulsewidth at high PRF while maintaining high efficiency, light weight and compactness.

SUMMARY OF THE INVENTION

Therefore, an object of the invention is to provide a high power, pulsed laser diode driver capable of generating high peak power light pulses at high PRF.

Another object of the invention is to provide a high power, pulsed laser diode driver capable of achieving high circuit efficiency, light weight and compactness.

In accordance with the present invention, this object can be accomplished by providing a semiconductor laser driver comprising control means for controlling an input drive signal, electric power conditioning and pulse charging means for receiving said drive signal controlled in said control means and thereby generating an electrical energy, energy storage means for receiving said electrical energy from said electric power conditioning and pulse charging means and storing the received electrical energy, triggering light source and drive means for generating a low power, optical laser light when the electrical energy has been stored in the energy storage means, optically activated semiconductor switch means for converting the capacitively charged electrical energy into a high current impulse, and a high power laser array for converting said high current impulse received from said optically activated semiconductor switch means into a high power, optical pulse to be outputted, wherein said energy storage means comprises an energy storage capacitor with a very low impedance.

BRIEF DESCRIPTION OF THE DRAWINGS

Other objects and aspects of the invention will become apparent from the following description of embodiments with reference to the accompanying drawings in which:

FIGS. 4a and 4b are a plan view and a cross-sectional view taken along the line A—A of FIG. 4a respectively illustrating a co-operation between an energy storage capacitor having a uniform impedance stripline structure in accordance with the present invention and a laser array;

FIGS. 7a to 7c are waveform diagrams respectively illustrating sequences of the energy flow of the energy storage capacitor having the uniform impedance stripline structure.

DETAILED DESCRIPTION OF THE PREFERRED EMBODIMENTS

Figure 1:
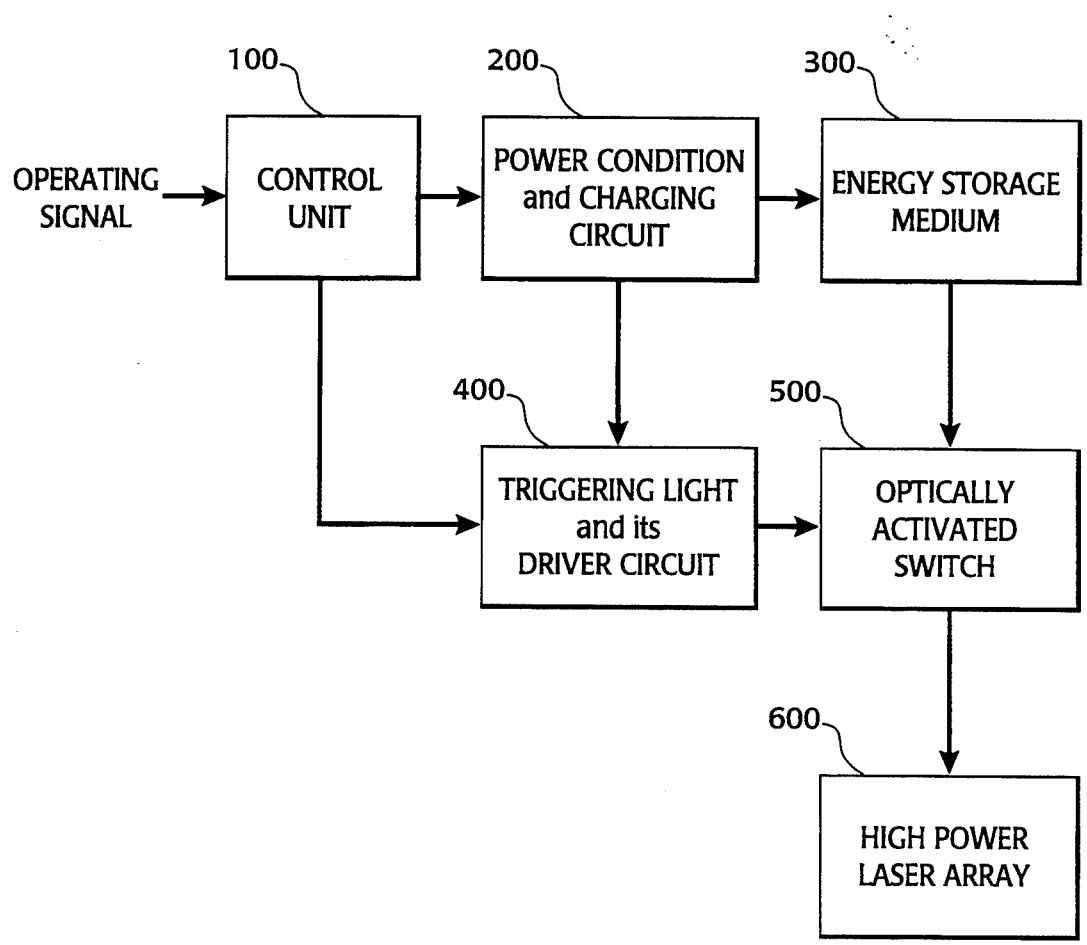
FIG. 1 is a block diagram of a high power, high PRF, compact, pulsed laser diode driver in accordance with the present invention.

FIG. 1 is a block diagram of a high power, high PRF, compact, pulsed laser diode driver in accordance with the present invention.

As shown in FIG. 1, the pulsed laser diode driver comprises a control unit 100, an electric power conditioning and pulse charging unit 200, an energy storage unit 300, a triggering light source and drive unit 400, an optically activated semiconductor switch unit 500, and a high power laser array 600.

The control unit 100 controls a signal introduced from an input stage and sends the controlled signal to the electric power conditioning and pulse charging unit 200. The control unit 100 also applies a signal to the triggering light source and drive unit 400.

The electric power conditioning and pulse charging unit 200 conditions the prime electrical energy derived from either AC power line or battery by the signal from the control unit 100 and then sends certain energy to the energy storage unit 300. The electric power conditioning and pulse charging unit 200 also sends certain energy to the triggering light source and drive unit 400.

The energy storage unit 300 includes a low impedance capacitor having a uniform stripline structure or a non-uniform stripline structure and stores the energy received from the electric power conditioning and pulse charging unit 200.

The triggering light source and drive unit 400 includes a triggering light source serving to output optical laser light of low (or middle) power while being driven upon receiving the control signal from the control unit 100 when the energy storage in the energy storage unit 300 is completed.

The optically activated semiconductor switch unit 500 is kinds of switches. The switch unit 500 is turned on by the laser light received from the triggering light source and drive unit 400 to convert the capacitively charged electrostatic energy into the high current impulse which is, in turn, sent to the high power laser array 600.

The high power laser array 600 outputs the high current impulse converted in the optically activated semiconductor switch unit 500 in the form of high power, optical pulse.

By signal from the control unit 100, the prime electrical energy, derived from either AC power line or battery, is conditioned and then used to capacitively charging the energy storage unit 300.

As the optical lights from the triggering optical source, delivered by two fiber optic pigtails of the triggering light source and drive unit 400, are introduced into the optically activated semiconductor switch unit 500, the capacitively charged electrostatic energy is converted into the high current impulse.

Rather than utilizing high voltage capacitor and high power semiconductor switch to modulate the laser arrays, the energy storage unit 300 utilizes the uniform stripline structure or the non-uniform stripline structure as the energy storage capacitor. This is because both the uniform stripline structure and the non-uniform stripline structure can provide design flexibility, high circuit efficiency, light weight and compactness.

In particular, with such stripline structures, designing an energy storage capacitor with very low circuit impedance becomes very easy. By using the laser diode triggered semiconductor switch, the critical limitations of the power semiconductor switches such as slow rise and fall times, low PRF and wide pulsewidth are easily overcame.

Successful combination of the low impedance energy storage capacitor and the low (or medium) power laser diode triggered semiconductor switch results in a compact, pulsed laser diode driver capable of generating high peak power light pulses with a narrow pulsewidth at high PRF.

Figure 2A:
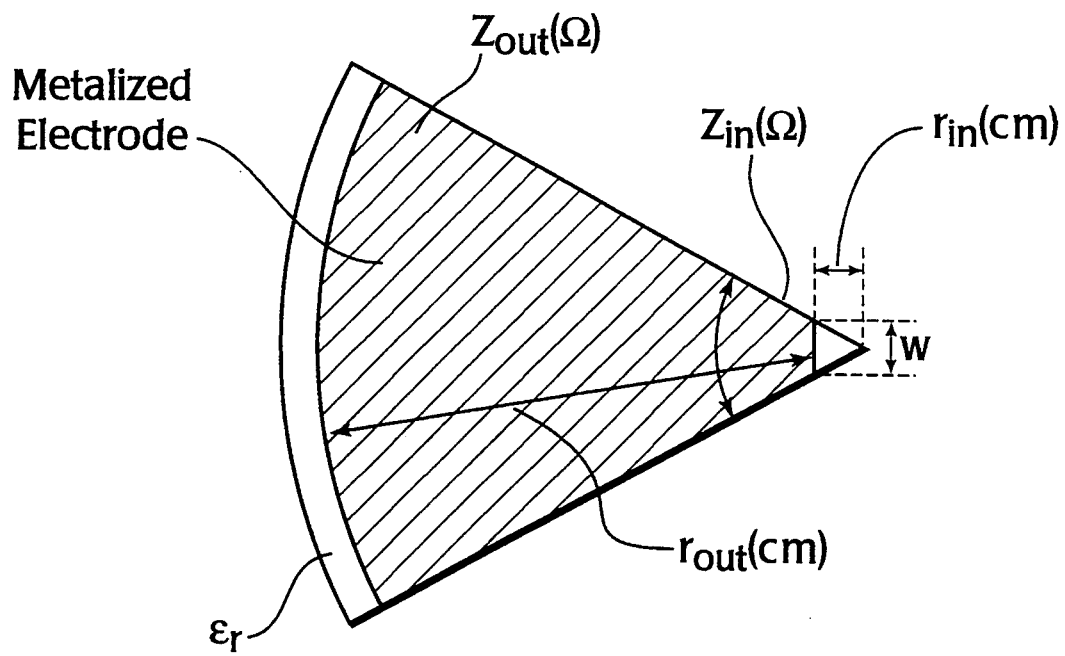
FIGS. 2a and 2b are a plan view and a cross-sectional view taken along the line A—A of FIG. 4a respectively illustrating an energy storage capacitor having a fan-shaped non-uniform impedance stripline structure in accordance with the present invention.
Figure 2B:
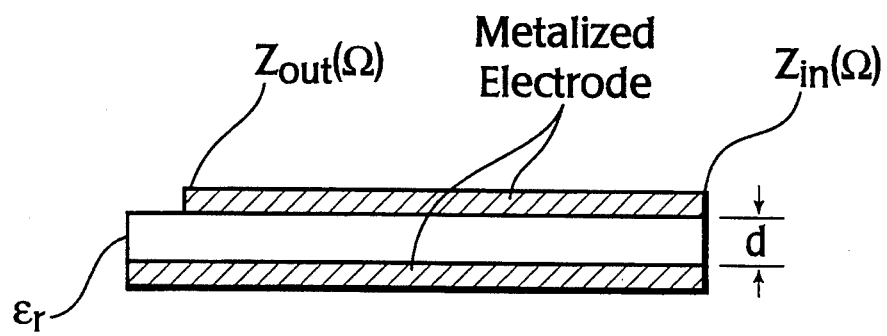
Figure 3A:
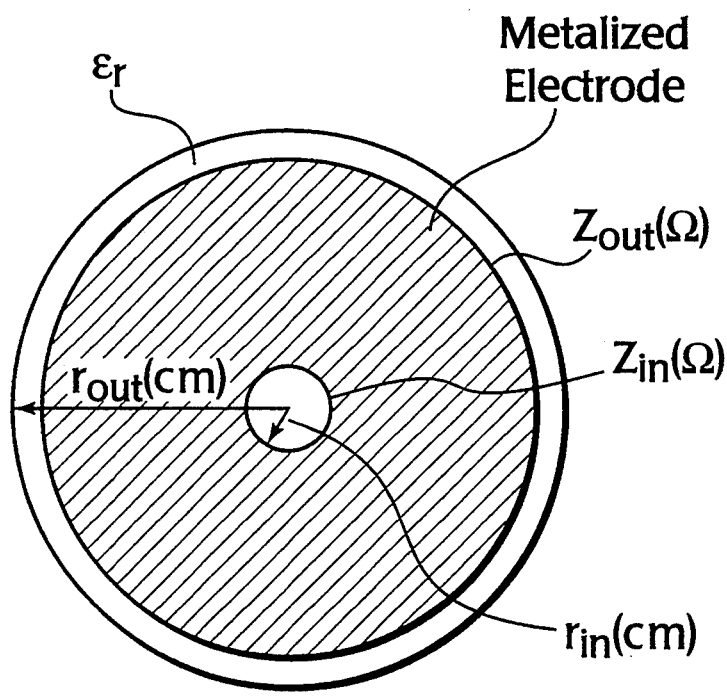
FIGS. 3a and 3b are a plan view and a cross-sectional view taken along the line A—A of FIG. 4a respectively illustrating an energy storage capacitor having a concentric strip-shaped non-uniform impedance stripline structure in accordance with the present invention.
Figure 3B:
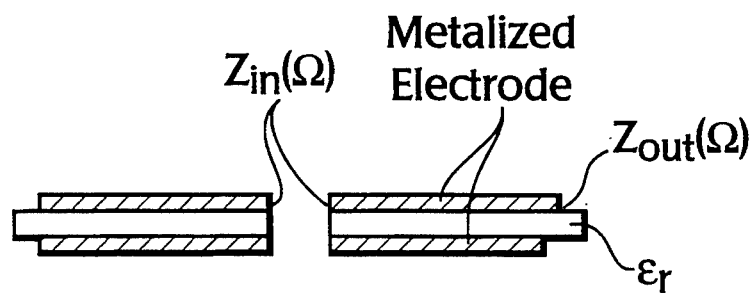
Figure 5:
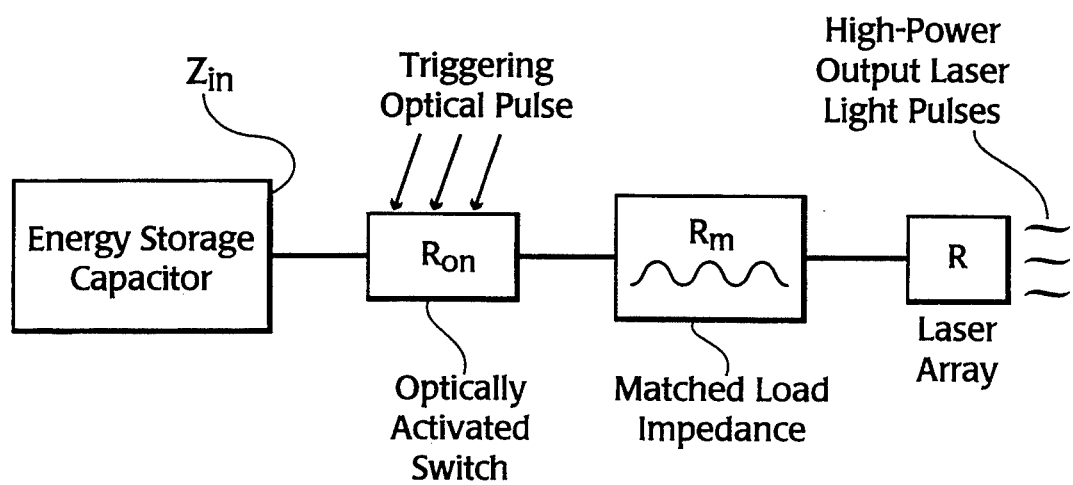
FIG. 5 is a block diagram illustrating a co-operation between the energy storage capacitor having non-uniform impedance stripline structure and the laser array in accordance with the present invention.

FIGS. 2a and 2b illustrate respectively the energy storage capacitor having a fan-shaped non-uniform impedance stripline structure in accordance with the present invention. FIGS. 3a and 3b illustrate respectively the energy storage capacitor having a concentric strip-shaped non-uniform impedance stripline structure in accordance with the present invention. FIGS. 4a and 4b illustrate respectively a co-operation between the energy storage capacitor having the uniform impedance stripline structure and the laser array in accordance with the present invention. FIG. 5 illustrates a co-operation between the energy storage capacitor having the non-uniform impedance stripline structure and the laser array in accordance with the present invention.

Where the energy storage unit 300 is constituted by an energy storage capacitor having the non-uniform impedance stripline structure of the fan shape or the concentric strip shape, as shown in FIGS. 2a and 2b, and 3a and 3b, respectively, the capacitance and characteristic impedance of the stripline are given as follows:

$$C = \epsilon_0 \epsilon_r A/t, \, Farad(F)$$

$$Z_0 = (377 \times t)/(\sqrt{\epsilon_r} \times w)$$

where, C is the capacitance, A is the electrode area of the capacitor, $\epsilon_0$ is the permittivity of free space, t is the thickness of the dielectric medium, $\epsilon_r$ is the dielectric constant of the dielectric medium, $Z_0$ is the characteristic impedance of the stripline and w is the width of the electrode of the stripline, respectively.

By properly selecting the dielectric constant of the substrate material, the thickness of the dielectric medium and the width of the electrode, an energy storage capacitor with a very low impedance is designed.

When the electrical energy is transferred from the low impedance capacitor to the high power laser array, most of it is used to operate the laser array. Accordingly, the low impedance capacitor greatly reduces the energy loss during the energy transfer form the capacitor to the laser array.

The main function of the energy storage unit 300 is temporarily holding the electrical energy in the form of the electrostatic energy. However, when the energy blocking switch is turned on, the boundary conditions of the energy storage capacitor at the contact area with the switch is changed from open to the close state. As soon as the boundary condition is changed, the electrostatic energy stored in the capacitor becomes traveling wave and starts to flow toward load through the switch.

In particular, when the energy storage capacitor is connected into the matched load impedance, as shown in FIG. 5, it acts like the transmission line. Rather than having the discharged waveforms with RC time constant decay curve, current pulses with sharp rise and fall times are produced. The pulsewidth of these pulses is about two-way wave transit time of the energy storage capacitor. And the amplitude of the current pulse is larger than the current amplitude obtained from the uniform impedance stripline due to the gaining factor associated with the impedance transformation. The generated current amplitude is given as follows:

$$I = (g \times V)/(Z_{in} + R_{on} + R_m), \, Ampere \, (A)$$

Where, g is the gaining factor due to the impedance transformation between the inner and outer characteristic impedances of the non-uniform stripline structure (the range of the coefficient value g is larger than 1, but less than 2), $R_m$ is the matched external impedance including the on-state impedance of the laser array), V is the pulse biased voltage, $Z_{in}$ is the inner characteristic impedance of the stripline, and $R_{on}$ is the on-state impedance of the semiconductor switch, respectively. In an ideal matched impedance case, in which $R_{on}$ is negligible and $Z_{in}$ and $R_m$ are the same, the generated current pulses becomes as follows:

$$I = (g/R_m) \times (V/2), \, Ampere \, (A)$$

This is almost like the well-defined matched uniform stripline except the gain factor g. The gain factor g provides additional circuit efficiency improvement. Therefore, utilization of the non-uniform, low impedance stripline structure as the energy storage capacitor results in an extremely high circuit efficiency.

On the other hand, where the energy storage unit 300 is constituted by an energy storage capacitor having the uniform impedance stripline structure, as shown in FIGS. 4a and 4b, the following capacitance C and characteristic impedance $Z_0$ of the stripline are given, as in the case of the non-uniform impedance stripline structure:

$$C = \epsilon_0 \epsilon_r A/d, \, Farad(F)$$

$$Z_0 = (377 \times d)/(\sqrt{\epsilon_r} \times w) \, (\Omega)$$

where, C is the capacitance, A is the electrode area of the capacitor, $\epsilon_0$ is the permittivity of free space, d is the thickness of the dielectric medium, $\epsilon_r$ is the dielectric constant of the dielectric medium, $Z_0$ is the characteristic impedance of the stripline and w is the width of the electrode of the stripline, respectively.

In particular, when the energy storage capacitor having the uniform impedance strip line structure shown in FIGS. 4a and 4b is connected into the matched load impedance, it acts like the transmission line. Rather than having the discharged waveforms with RC time constant decay curve, current pulses with sharp rise and fall times are produced. The amplitude of the current pulses is larger than the current amplitude obtained from the non-uniform impedance stripline due to the gaining factor associated with the impedance transformation. The generated current amplitude is given as follows:

$$I = V/(2 \times R_m), \, Ampere \, (A)$$

The pulsewidth of these pulses is about two-way wave transit time of the energy storage capacitor and given as follows:

$$PW = (2 \times \sqrt{\epsilon_r} \times L)/(3 \times 10^{10}), \text{ second (s)}$$

where $\epsilon_r$ is the dielectric constant of the dielectric medium, and L (in centimeter) is the length of the electrode.

The action of the driver starts by forwarding the operating instruction to the control unit 100 which initiates sequence of actions. At first the electrical power conditioning and pulse charging unit 200 is activated. The prime power from either AC power line or battery is conditioned and used to pulse charging the capacitor of the energy storage unit 300. At the time the pulse biasing voltage of the capacitor reaches the peak voltage, the triggering light source and drive unit 400 is activated by the control signal from the control unit 100.

The triggering light source and drive unit 400 generates a fast rise time optical pulse at very high PRF. The generated optical pulse, is coupled into fiber optic pigtail, delivered through the fiber optic pigtail, and used to activate the semiconductor switch unit 500.

Once triggering optical light is penetrated into the active area of the semiconductor switch unit 500, it produces sufficient numbers of the photon-generated electron-hole pairs so that the state of the switch changes from completely open (non-conducting) to completely closing (conducting).

When the switch is turned on, the electrostatic energy stored in the capacitor of the energy storage unit 300 is discharged in the form of the narrow current pulses. As the current pulses, well beyond the threshold level, are flowed onto the laser array 600, high power laser light pulses with fast rise and fall times are generated.

Figure 6A:
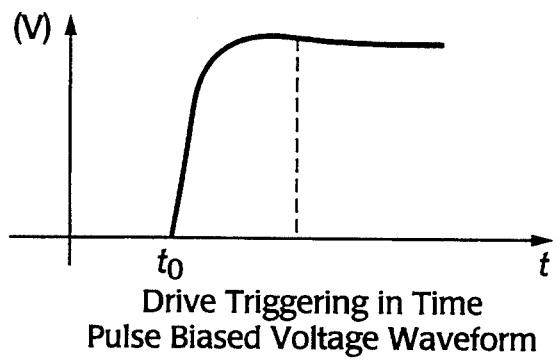
FIGS. 6a to 6c are waveform diagrams respectively illustrating sequences of the energy flow of the energy storage capacitor having the non-uniform impedance stripline structure.
Figure 6B:
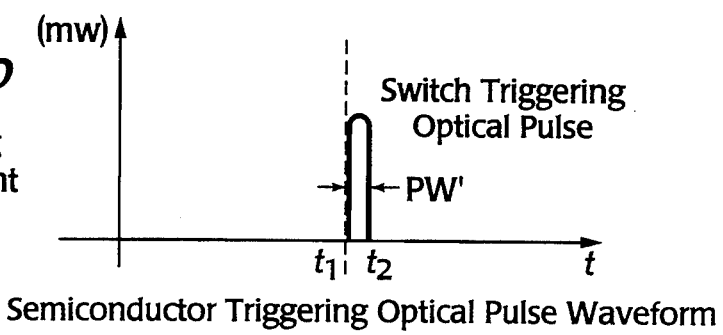
Figure 6C:
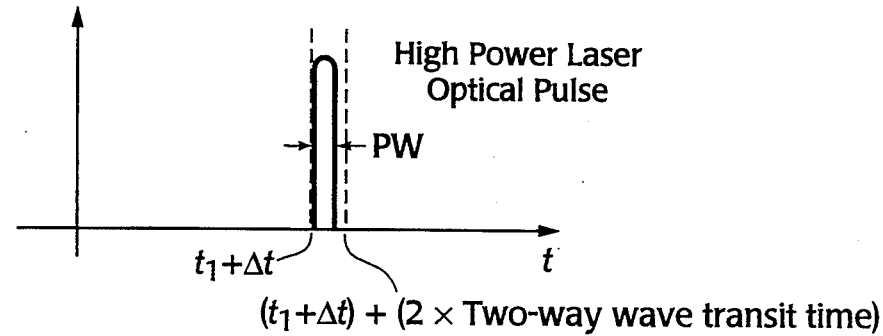

The graphical sequences of the energy flow of the driver having the non-uniform impedance stripline structure are given in FIGS. 6a, 6b and 6c. When the semiconductor switch unit 500 is triggered, the generated optical pulse shape is very similar to the driving current pulse shape except the rise time of the output laser pulse is faster than the rise time of the driving current pulse. However, the pulse width of the generated current pulses is determined by the pulsewidth of the triggering optical pulses as well as the wave transit time in the energy storage capacitor. In a well matched impedance case, the pulsewidth of the output laser light will be about two-way wave transit time in the energy storage capacitor, as expressed by the following equation:

$$PW = (2 \times \sqrt{\epsilon_r} \times (r_{out} - r_{in})/(3 \times 10^{10}), \text{ second (s)}$$

In the case of the severe impedance mismatch case, the pulsewidth of the output laser light will be more or less longer than the pulsewidth of the triggering optical pulse. This is mainly due to the multi-reflections of the traveling wave, caused by the severely mismatched impedance.

For the power semiconductor switch, as the power handling capability of the power semiconductor switch increases, both the rise time and the fall time of the switch slow down and its switch-on time becomes longer. As a consequence, PRF capability of the power semiconductor switch goes down rapidly as the power handling capability of these switches goes up slowly.

Rather than producing current pulse by the high power semiconductor switch, by generating fast rise time optical pulse from the low (or medium) power laser diode and using it as the triggering light, the semiconductor laser driver is able to generate high current pulses with fast rise time.

When the semiconductor switch unit 500 is triggered in the case of the driver having the uniform impedance stripline structure shown in FIGS. 4a and 4b, the generated optical pulse shape is very similar to the driving current pulse shape except the rise time of the output laser pulse is faster than the rise time of the driving current pulse. The pulse width of the generated current pulses is determined by the pulsewidth of the triggering optical pulses as well as the wave transit time in the energy storage capacitor.

Figure 7C:
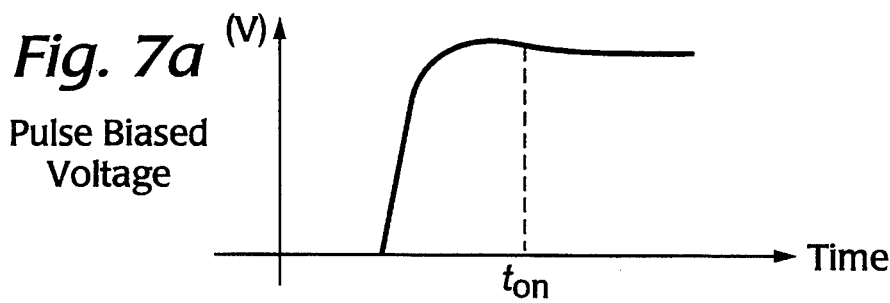
Figure 7C:
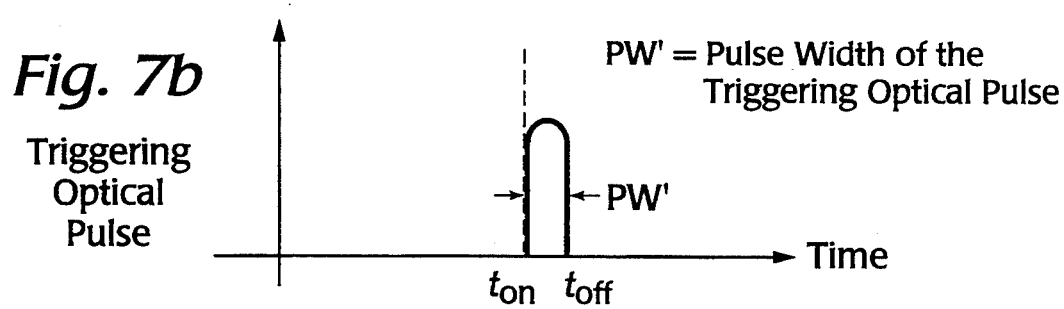
Figure 7C:
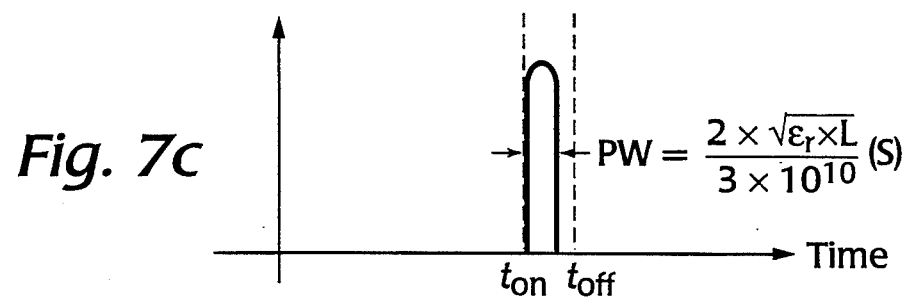

In a well matched impedance case, the pulsewidth of the output laser light in the case of the uniform impedance strip line structure of the energy storage unit 300 will be about two-way wave transit time in the energy storage capacitor, as shown in FIGS. 7a to 7c. The pulsewidth can be expressed by the following equation:

$$PW = (2 \times \sqrt{\epsilon_r} \times L)/(3 \times 10^{10}), \text{ second (s)}$$

The uniform impedance stripline structure is more or less insufficient in terms of the efficiency, as compared to the non-uniform impedance strip line structure. This is because the uniform impedance stripline structure can not generate any gain g of current pulses. However, the uniform impedance stripline structure can obtain sharply high output pulses because it can eliminate the multi-reflections of the traveling wave, by virtue of its well matched impedance.

Accordingly, the geometrical effect of the uniform stripline structure enables the design of a compact energy storage capacitor with very low impedance. This low impedance capacitor reduces greatly the energy loss during the energy transfer from the capacitor to the laser array.

The resultant pulsed driver which is very efficient eliminates the need for the high-power power supply as well as the heat removing fan.

As apparent from the above description, the present invention provides a high power, pulsed laser driver including a low impedance energy storage capacitor having a non-uniform stripline structure or a uniform stripline structure. Hence, it is possible to greatly reduce the loss of electrical energy of the laser array while maintaining high efficiency, light weight and compactness.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor laser driver which controls an input drive signal to generate a low power laser optical light, and thereby generate a high current impulse, said driver comprising:

control means for controlling the input drive signal;

electric power conditioning and pulse charging means for receiving said drive signal controlled in said control means and thereby generating an electrical energy;

energy storage means:
  for receiving said electrical energy from said electric power conditioning and pulse charging means, and
  for storing the received electrical energy;

a triggering light source;

drive means for powering the triggering light source and for thereby generating the low power, optical laser light;

optically activated semiconductor switch means for activation by the low power optical laser light and for converting the electrical energy in the energy storage means into the high current impulse; and a high power laser array for converting said high current impulse received from said optically activated semiconductor switch means into a high power, optical pulse;

wherein said energy storage means comprises an energy storage capacitor with a very low impedance; and wherein said energy storage capacitor has a non-uniform impedance stripline structure having a concentric strip shape.

2. A semiconductor laser driver which controls an input drive signal to generate a low power laser optical light, and thereby generate a high current impulse, said driver comprising:

control means for controlling the input drive signal;

electric power conditioning and pulse charging means for receiving said drive signal controlled in said control means and thereby generating an electrical energy;

energy storage means:
  for receiving said electrical energy from said electric power conditioning and pulse charging means, and
  for storing the received electrical energy;

a triggering light source;

drive means for powering the triggering light source and for thereby generating the low power, optical laser light;

optically activated semiconductor switch means for activation by the low power optical laser light and for converting the electrical energy in the energy storage means into the high current impulse; and a high power laser array for converting said high current impulse received from said optically activated semiconductor switch means into a high power, optical pulse;

wherein said energy storage means comprises an energy storage capacitor with a very low impedance;
  wherein said energy storage capacitor has a non-uniform impedance stripline structure having a fan shape.

3. A semiconductor laser driver which controls an input drive signal to generate a low power laser optical light, and thereby generate a high current impulse, said driver comprising:

control means for controlling the input drive signal;

electric power conditioning and pulse charging means for receiving said drive signal controlled in said control means and thereby generating an electrical energy;

energy storage means:
  for receiving said electrical energy from said electric power conditioning and pulse charging means, and
  for storing the received electrical energy;

a triggering light source;

drive means for powering the triggering light source and for thereby generating the low power, optical laser light;

optically activated semiconductor switch means for activation by the low power optical laser light and for converting the electrical energy in the energy storage means into the high current impulse; and a high power laser array for converting said high current impulse received from said optically activated semiconductor switch means into a high power, optical pulse;

wherein said energy storage means comprises an energy storage capacitor with a very low impedance;

wherein said energy storage capacitor has a uniform impedance stripline structure.

* * * * *